US012757694B2

(12) United States Patent
Lin et al.

(10) Patent No.: US 12,757,694 B2
(45) Date of Patent: Oct. 6, 2026

(54) ISOLATION STRUCTURES AND METHODS OF FORMING THE SAME

(71) Applicant: Taiwan Semiconductor Manufacturing Company, Ltd., Hsinchu (TW)

(72) Inventors: Shih-Wei Lin, Taipei City (TW); Hau-Yan Lu, Hsinchu City (TW); Te-Hsien Hsieh, Kaohsiung City (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 713 days.

(21) Appl. No.: 18/194,484

(22) Filed: Mar. 31, 2023

(65) Prior Publication Data

US 2024/0332061 A1 Oct. 3, 2024

(51) Int. Cl.
*H10W 10/17* (2026.01)
*H10W 10/00* (2026.01)

(52) U.S. Cl.
CPC ....... *H10W 10/17* (2026.01); *H10W 10/0143* (2026.01)

(58) Field of Classification Search
CPC ............ H01L 21/76229; H10D 62/115; H10D 62/116
See application file for complete search history.

(56) References Cited

U.S. PATENT DOCUMENTS 6,071,822 A * 6/2000 Donohue ............ B81C 1/00571 438/719
6,306,723 B1 * 10/2001 Chen ................. H01L 21/76229 257/E21.548
8,525,264 B1 * 9/2013 Assefa ................. H10D 86/201 257/350
11,442,230 B2 9/2022 Lee et al.
2006/0091461 A1 * 5/2006 Chen .................... H10D 30/791 438/150
2007/0059897 A1 * 3/2007 Tilke ................... H01L 21/3065 257/E21.235
2009/0072355 A1 * 3/2009 Cheng ............... H01L 21/76229 257/622
2010/0244183 A1 * 9/2010 Aoki ...................... H10D 86/01 257/E29.02
2011/0115047 A1 * 5/2011 Hebert ................. H10D 10/051 257/E29.174

(Continued)

FOREIGN PATENT DOCUMENTS

JP 5206311 B2 * 6/2013

OTHER PUBLICATIONS

Machine translation of JP 5206311 (Year: 2013).*

*Primary Examiner* — Bryan R Junge
(74) *Attorney, Agent, or Firm* — Harrity & Harrity, LLP

(57) ABSTRACT

Depositing an oxide material on sidewalls of trenches between etching cycles allows narrower trenches to be etched to increased depths without causing over-etching of wider trenches. As a result, efficiency of a device including the trenches (e.g., a silicon photonics (SiPh) device or a pixel device, among other examples) is increased. For example, because light leakage and light scattering is reduced in an SiPh device, power is conserved at a transmission device that can decrease transmit power on account of the increased efficiency.

20 Claims, 16 Drawing Sheets

(56) References Cited

U.S. PATENT DOCUMENTS

| | | | | |
|---|---|---|---|---|
| 2011/0143519 | A1* | 6/2011 | Lerner | H01L 21/76264 438/433 |
| 2016/0027684 | A1* | 1/2016 | Chang | H10D 84/0158 438/424 |
| 2018/0358257 | A1* | 12/2018 | Enda | H01L 21/762 |
| 2024/0234158 | A1* | 7/2024 | Roy | H01L 21/32137 |

* cited by examiner

ISOLATION STRUCTURES AND METHODS OF FORMING THE SAME

BACKGROUND

In silicon photonics (SiPh), silicon is used as an optical medium. For example, SiPh devices may be used for optical communications and optical routers. Additionally, some SiPh devices may include integrated electronic components on a same silicon substrate for processing transmitted or received optical signals.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
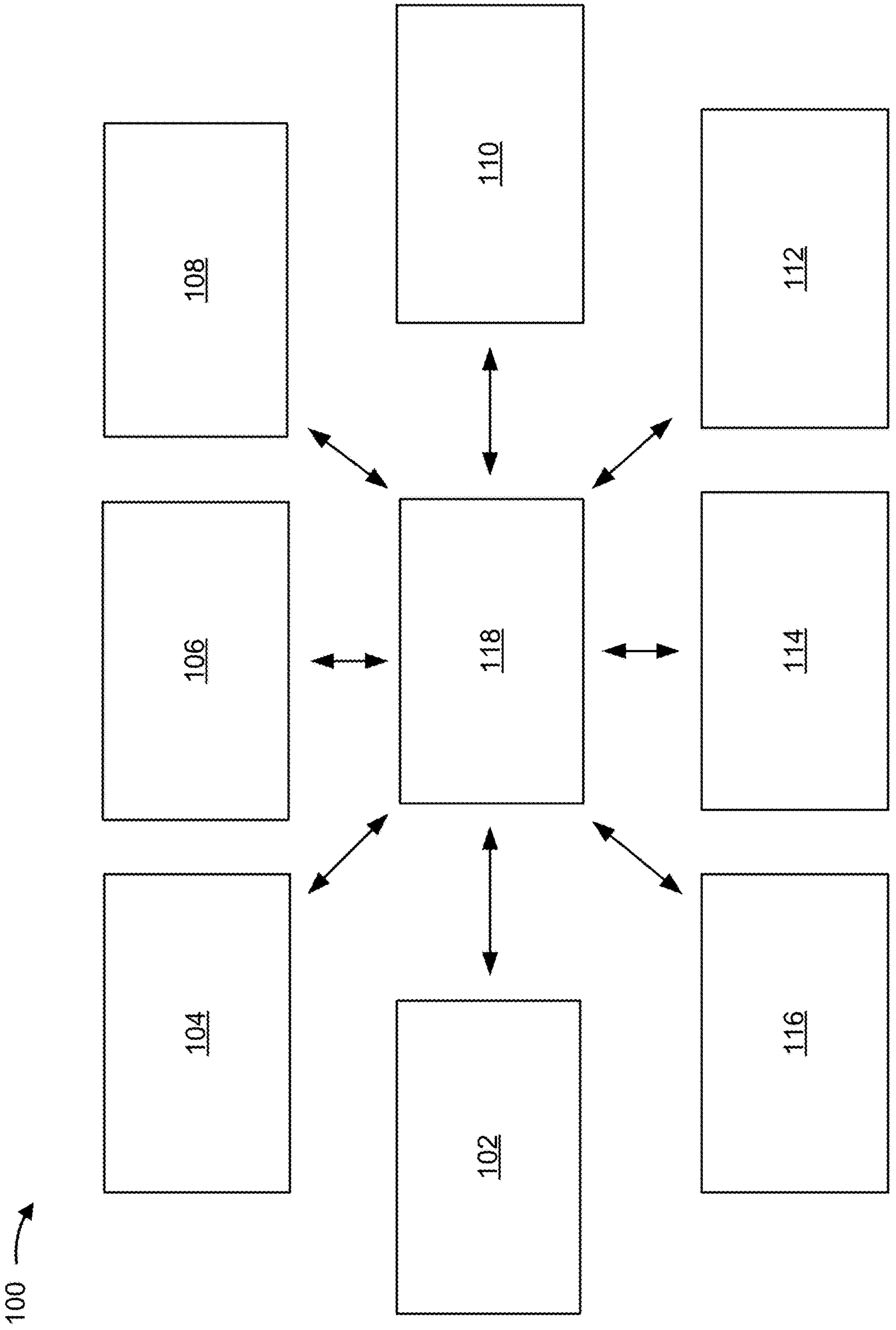
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In many electronic devices, large and small trenches are combined. For example, in a silicon photonics (SiPh) device, a line may be formed between a large trench and a small trench. In another example, in a pixel device, a small photodiode (SPD) may be paired with a large photodiode (LPD) such that large and small trenches are both present.

However, etch profiles are width dependent. Accordingly, the smaller isolation trenches may remain under-etched (e.g., after a wet etch cycle). In an SiPh device, under-etching can result in light leakage. As a result, efficiency of the SiPh device is decreased, which wastes power at a transmission device that will increase transmit power in order to compensate for the light leakage. In a pixel device, under-etching can result in light leakage as well as increased dark current.

Using one or more additional etching cycles may result in the smaller isolation trenches no longer being under-etched. However, additional etching cycles may result in the larger isolation trenches being over-etched. For example, sidewalls of the larger isolation trenches may be etched wider (e.g., up to 100 nanometers (nm) wider), particularly closer to bottom surfaces of the larger isolation trenches. In an SiPh device, over-etching can result in light scattering off the damaged sidewalls. As a result, efficiency of the SiPh device is decreased, which wastes power at a transmission device that will increase transmit power in order to compensate for the light leakage. In a pixel device, over-etching can similarly result in light scattering and thus efficiency loss.

Some implementations described herein provide techniques and apparatuses for depositing a layer of oxide on sidewalls of trenches between etching cycles. The layer of oxide on the sidewalls of the trenches protects the sidewalls from being etched in subsequent etching cycles. As a result, trenches with smaller widths may be etched to increased depths without causing over-etching of trenches with greater widths. As a result, efficiency of a device including the trenches (e.g., an SiPh device or a pixel device, among other examples) is increased. For example, because light leakage and light scattering is reduced in an SiPh device, power is conserved at a transmission device that can decrease transmit power on account of the increased efficiency.

In some implementations, the oxide material may be formed, selectively, over silicon and anisotropically etched from bottom surfaces of the trenches. Accordingly, the oxide material protects sidewalls of the trenches (particularly wider trenches) without preventing depths of the trenches from being increased (particularly narrower trenches), subject to an etch stop layer (ESL).

FIG. 1 is a diagram of an example environment 100 in which systems and/or methods described herein may be implemented. As shown in FIG. 1, environment 100 may include a plurality of semiconductor processing tools 102-116 and a wafer/die transport tool 118. The plurality of semiconductor processing tools 102-116 may include a deposition tool 102, an exposure tool 104, a developer tool 106, an etch tool 108, a planarization tool 110, a plating tool 112, a photoresist removal tool 114, an annealing tool 116, and/or another semiconductor processing tool. The tools included in the example environment 100 may be included in a semiconductor clean room, a semiconductor foundry, a semiconductor processing and/or manufacturing facility, or another location.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a low pressure CVD (LPCVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, an epitaxy tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

The photoresist removal tool 114 is a semiconductor processing tool that is capable of removing remaining portions of a photoresist layer from a substrate after the etch tool 108 removes portions of the substrate. For example, the photoresist removal tool 114 may use a chemical stripper and/or another technique to remove a photoresist layer from a substrate.

The annealing tool 116 is a semiconductor processing tool that includes a semiconductor processing chamber and one or more devices capable of heating a semiconductor substrate or semiconductor device. For example, the annealing tool 116 may include a rapid thermal annealing (RTA) tool or another type of annealing tool that is capable of heating a semiconductor substrate to cause a reaction between two or more materials or gasses, to cause a material to decompose. As another example, the annealing tool 116 may be configured to heat (e.g., raise or elevate the temperature of) a structure or a layer (or portions thereof) to re-flow the structure or the layer, or to crystallize the structure or the layer, to remove defects such as voids or seams. As another example, the annealing tool 116 may be configured to heat (e.g., raise or elevate the temperature of) a layer (or portions thereof) to enable bonding of two or more semiconductor devices.

The wafer/die transport tool 118 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 118 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations).

In some implementations, one or more of the semiconductor processing tools 102-116 and/or the wafer/die transport tool 118 may perform one or more semiconductor processing operations described herein. For example, one or more of the semiconductor processing tools 102-116 and/or the wafer/die transport tool 118 may form, in a silicon layer, a first trench associated with a first width and a second trench associated with a second width larger than the first width; deposit an oxide material on sidewalls and a bottom surface of the first trench and on sidewalls of the second trench; perform a first etching process to remove the oxide material from the bottom surface of the first trench; and/or perform a second etching process to increase a depth of the first trench, among other examples.

The number and arrangement of tools shown in FIG. 1 are provided as one or more examples. In practice, there may be additional tools, fewer tools, different tools, or differently arranged tools than those shown in FIG. 1. Furthermore, two or more tools shown in FIG. 1 may be implemented within a single tool, or a single tool shown in FIG. 1 may be implemented as multiple, distributed tools. Additionally, or alternatively, a set of tools (e.g., one or more tools) of environment 100 may perform one or more functions described as being performed by another set of tools of environment 100.

Figure 2:
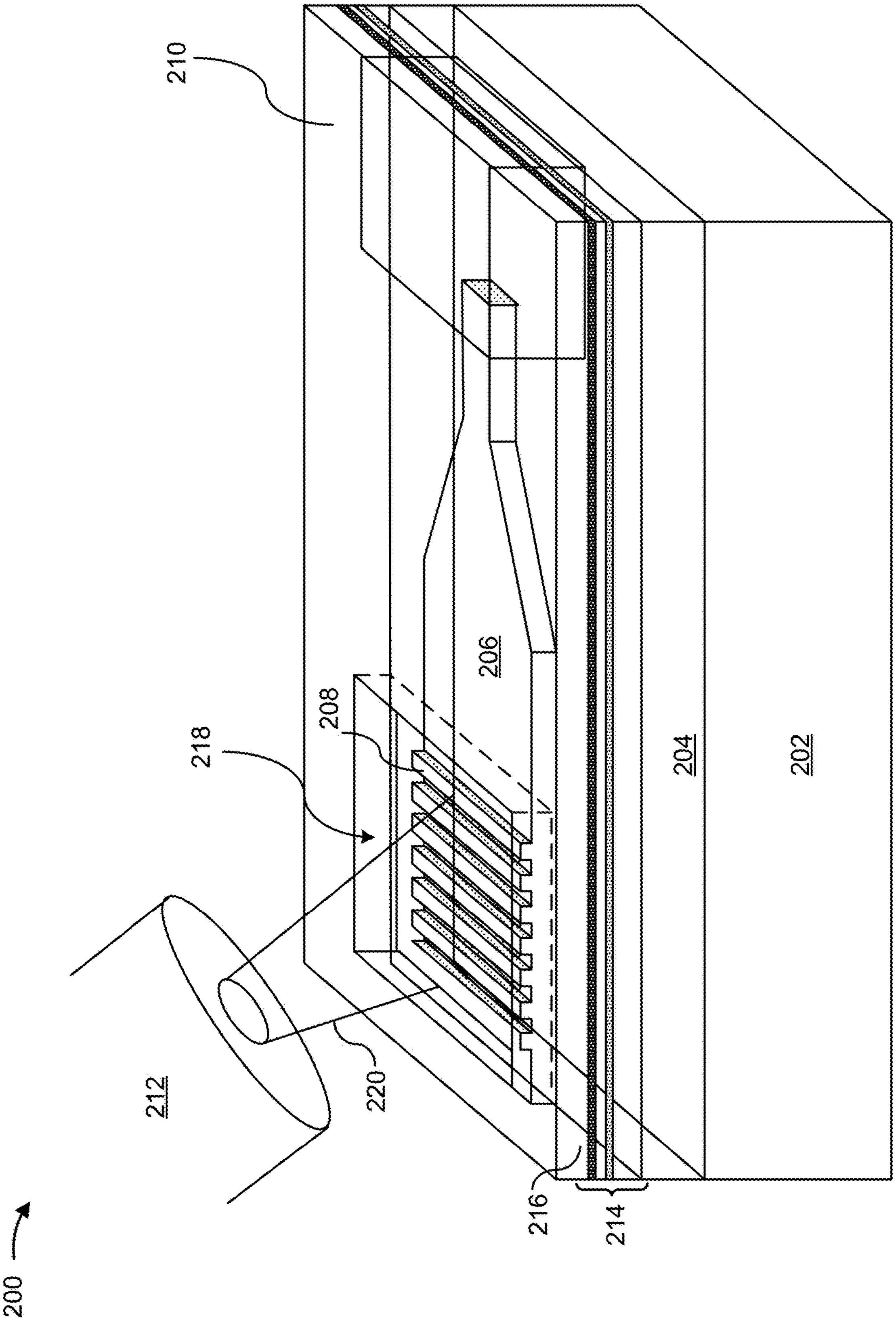
FIG. 2 is a diagram of an example semiconductor structure described herein.

FIG. 2 is a diagram of an example SiPh device 200 described herein. FIG. 2 shows a see-through perspective view of the example SiPh device 200. The example SiPh device 200 may be formed using a silicon-on-insulator (SOI) substrate that includes a silicon substrate 202 and a buried insulating layer 204. The silicon substrate 202 may have a thickness in a range from approximately 500 micrometers (μm) to approximately 1 millimeter (mm). By selecting a thickness of at least 500 μm, the silicon substrate 202 physically supports remaining portions of the SiPh device 200. By selecting a thickness of no more than 1 mm, the SiPh device 200 may be bundled in an optical package with additional semiconductor devices. However, other values for the range are within the scope of the present disclosure. The thickness of the buried insulating layer 204 may be determined to reduce (or at least locally minimize) optical reflection at an interface with the silicon substrate 202. For example, the thickness of the buried insulating layer 204 may be in a range from approximately 100 nanometers (nm) to approximately 400 nm. However, other values for the range are within the scope of the present disclosure. The buried insulating layer 204 may include a silicon oxide, such as a thermal silicon oxide, which is a stoichiometric silicon oxide with a composition of $SiO_2$ and formed by thermal oxidation of silicon.

The buried insulating layer 204 may support a silicon grating structure 206. The silicon grating structure 206 includes a one-dimensional periodic array of silicon line structures 208. In some implementations, the silicon line structures 208 are adjoined to a top surface of a silicon plate having a uniform height. One end of the silicon plate (also referred to as a "distal end") may be tapered to provide a variable width that decreases with a lateral distance from the periodic array of silicon line structures 208.

A vertical distance between top surfaces of the silicon line structures 208 and a bottom surface of the silicon plate may be in a range from approximately 10 nm to approximately 300 nm. However, other values for the range are within the scope of the present disclosure. The vertical distance may be selected within the range based on a wavelength of light to be used with the example SiPh device 200 (e.g., for optical communication). Additionally, a pitch of the silicon line structures 208 along a direction perpendicular to a lengthwise direction of the silicon line structures 208 (in other words, along a direction of the pitch of the silicon line structures 208 because the direction of the pitch is the same as a lengthwise direction of the silicon grating structure 206) may be approximately equal to the wavelength of the light to be used with the example SiPh device 200 (e.g., within a medium of silicon in the silicon grating structure 206) along a direction of a periodicity of the silicon grating structure 206. Because the relative permittivity of silicon (in other words, the dielectric constant of silicon) is approximately 11.7, the pitch of the silicon line structures 208 along the lengthwise direction of the silicon grating structure 206 may be approximately equal to the wavelength of the light divided by 11.7. For example, the pitch of the silicon line structures 208 along the direction of the periodicity of the silicon grating structure 206 may be in a range from approximately 80 nm to approximately 200 nm, although lesser and greater pitches may also be used.

As further shown in FIG. 2, an electronic device 210 may be coupled to the distal end of the silicon grating structure 206. For example, an optical switch, a light source, and/or a light detector may be coupled to the distal end of the silicon grating structure 206. The silicon grating structure 206 may provide optical coupling between an optical fiber 212 and the electronic device 210, which may be formed over the buried insulating layer 204. For example, a combination of the silicon grating structure 206, a dielectric layer 214 (e.g., formed of one or more dielectric materials, as shown in FIG. 2) overlying the silicon grating structure 206 and providing contrast in refractive indices at an interface with the silicon grating structure 206, and a passivation layer 216 overlying the dielectric layer 214 and including an opening 218 therethrough may optically couple the optical fiber 212 to the electronic device 210. The optical fiber 212 may include an end surface for receiving or emitting light 220 that is directed at the opening 218 in the passivation layer 216.

The passivation layer 216 may include one or more of silicon carbide, silicon nitride, undoped silicate glass, a doped silicate glass, silicon oxynitride, organosilicate glass, or a low dielectric constant (low-k) dielectric material, such as porous organosilicate glass. A thickness of the passivation layer 216 may be selected to shield ambient light in order to prevent optical noise from entering the silicon grating structure 206 or the electronic device 210. For example, the passivation layer 216 may have a thickness in a range from approximately 3 μm to approximately 30 μm, although lesser and greater thicknesses may also be used.

As indicated above, FIG. 2 is provided as an example. Other examples may differ from what is described with regard to FIG. 2.

Figure 3A:
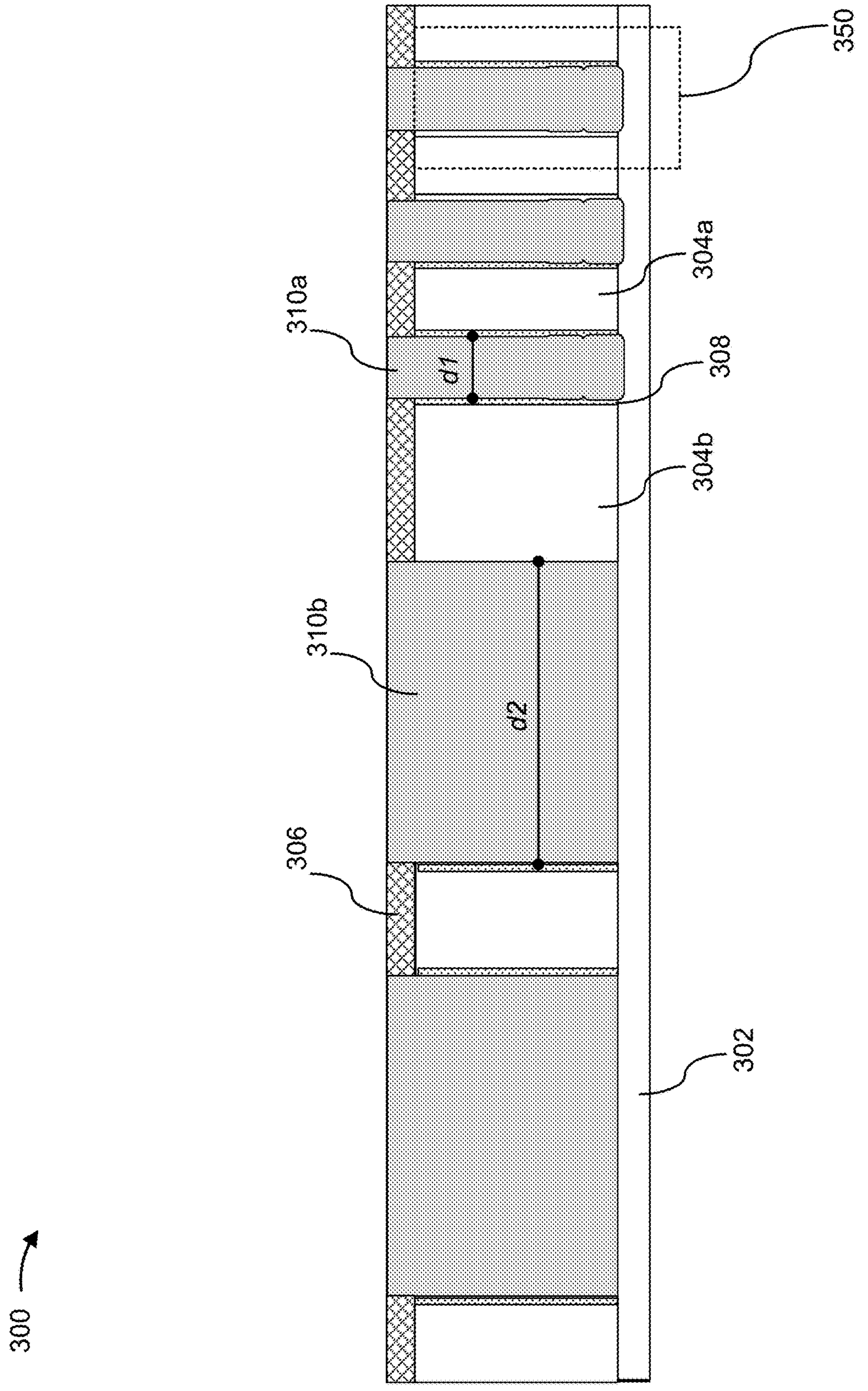
FIGS. 3A-3B are diagrams of an example semiconductor structure described herein.

FIG. 3A is a diagram of an example semiconductor structure 300 described herein. The example semiconductor structure 300 includes differently sized trenches. The narrower trenches shown in FIG. 3A include a scallop profile, as described in greater detail in connection with FIG. 3B.

As shown in FIG. 3A, the example semiconductor structure 300 includes a supporting layer 302. The supporting layer 302 may include at least one ESL. An ESL includes a material that is resistant (or at least partially resistant) to particular types of dry etching and/or wet etching. An ESL may include a material that is resistant to etchants that may otherwise be used to etch other layers near the ESL. Selecting such a material provides etch selectivity and enables the ESL to remain unetched (or mostly unetched) while other layers are etched. For example, an ESL may include a nitride (such as aluminum nitride (AlN) and/or silicon nitride (SiN)) and/or an oxide (such as a silicon oxynitride ($SiO_xN_y$), aluminum oxynitride (AlON), and/or a silicon oxide ($SiO_x$)). In some implementations, the supporting layer 302 includes a plurality of ESLs stacked together and configured to function as a single ESL.

The supporting layer 302 may physically support operational structures 304. In some implementations, the operational structures 304 are silicon operational structures, such as silicon waveguides. For example, the operational structures 304 may be lines (e.g., silicon line structures 208 of the silicon grating structure 206 of the example SiPh device 200 of FIG. 2). In another example, the operational structures 304 may include pixels configured to convert incoming photons into electrical signals.

As shown in FIG. 3A, the operational structures 304 may be of different sizes (e.g., different widths). For example, operational structure 304*a* may include a line that has a width in a range from approximately 0.3 μm to approximately 10 μm. However, other values for the range are within the scope of the present disclosure. Selecting a smaller width (e.g., closer to 0.3 μm) results in the operational structure 304*a* filtering light with wavelengths greater than that of most ultraviolet light (e.g., wavelengths greater than 300 nm). Selecting a larger width (e.g., closer to 10 μm), the operational structure 304*a* may filter light with wavelengths greater than that of most infrared light (e.g., wavelengths greater than 0.01 millimeters). On the other hand, operational structure 304*b* may include a waveguide that is wider than the operational structure 304*a*.

In some implementations, a hard mask 306 remains over the operational structures 304. The hard mask (also referred to as "HM") 306 may be used to form one or more components of the semiconductor structure 300, as described in connection with FIGS. 4A-4J. The hard mask 306 may include silicon germanium (SiGe), a silicon nitride ($Si_xN_y$), a silicon oxide ($SiO_x$), and/or another type of masking material. In some implementations, the hard mask 306 may be removed (e.g., before formation of isolation structures 310, as described in connection with FIGS. 4I and 4J).

As further shown in FIG. 3A, an oxide material 308 may remain (at least in trace amounts) on sidewalls of the isolation structures 310. As used herein, "trace amounts" refer to amounts present on less than 50% of a surface area. The oxide material 308 may include oxidized silicon of the operational structures 304. Additionally, or alternatively, the oxide material 308 may include an oxide (e.g., silicon oxynitride ($SiO_xN_y$), aluminum oxynitride (AlON), and/or a silicon oxide ($SiO_x$), among other examples) formed using ALD. In some implementations, the oxide material 308 may be removed (e.g., before formation of isolation structures 310, as described in connection with FIGS. 41 and 4J).

In some implementations, the isolation structures 310 are dielectric isolation structures, such as deep trench isolation (DTI) structures. For example, the isolation structures 310 may be coated or lined (e.g., with an antireflective coating (ARC), among other examples) and filled with a dielectric material.

As shown in FIG. 3A, the isolation structures 310 may be of different sizes (e.g., different widths). For example, isolation structure 310*a* may be associated with a width (e.g., represented by d1 in FIG. 3A) in a range from approximately 0.3 μm to approximately 1.0 μm. Selecting a width of at least 0.3 μm reduces interference between neighboring operational structures. Selecting a width of no more than 1.0 μm reduces light loss by reducing a surface area of the isolation structure 310*a*. The isolation structure 310*a* may be adjacent to the operational structure 304*a*, which may be a line as described above. On the other hand, isolation structure 310*b* may be associated with a width (e.g., represented by d2 in FIG. 3A) in a range from approximately 1.0 μm to approximately 10 μm. Selecting a width of at least 1.0 μm reduces interference between neighboring operational structures. Selecting a width of no more than 10 μm reduces light loss by reducing a surface area of the isolation structure 310*b*. The isolation structure 310*b* may be adjacent to the operational structure 304*b*, which may be a waveguide as described above. However, other values for the range are within the scope of the present disclosure.

As further shown in FIG. 3A, narrower isolation structures extend into the supporting layer 302 lower than wider isolation structures. For example, as similarly described in connection with FIG. 3B, a narrower isolation structure 310*a* may extend a depth into the supporting layer 302 even though a bottom surface of a wider isolation structure 310*b* is approximately overlapping with a top surface of the supporting layer 302.

Figure 3B:
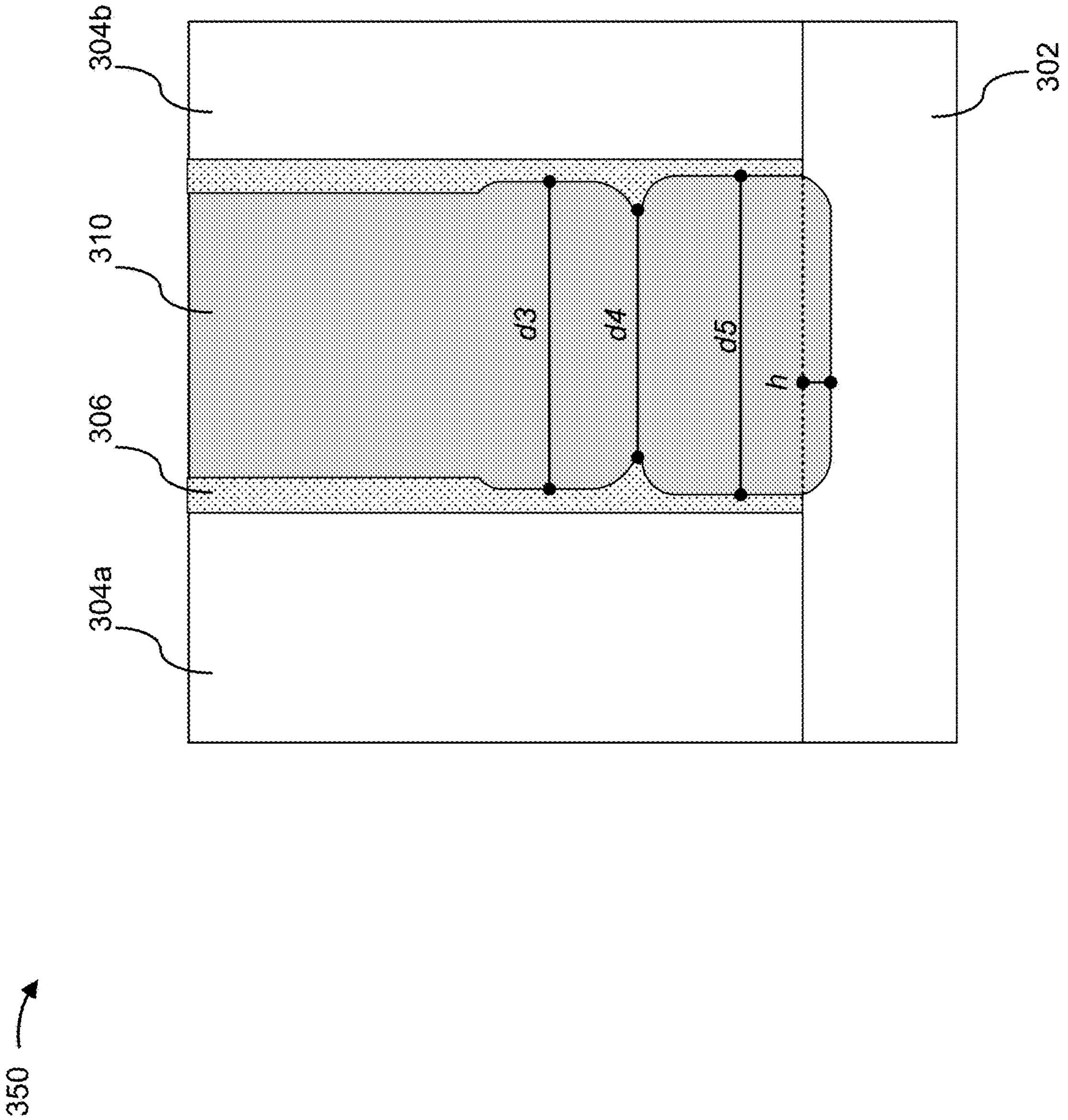

As shown in FIG. 3A, narrower isolation structures include scallop profiles. FIG. 3B shows a more detailed view 350 of the blocking layer of the example semiconductor structure 300. As shown in FIG. 3B, an isolation structure 310 is between an operational structure 304*a* and an operational structure 304*b* and includes a scallop profile. A "scallop profile" may include an oscillating width around a least a lower portion of a structure. In some implementations, the lower portion of the structure may be approximately 30 nm or less in height. For example, the lower portion of the structure may be formed using one or more cycles of oxidation and etching (e.g., as described in connection with FIGS. 4C-4H) while a remaining portion of the structure (a higher portion of the structure) may be formed using photolithography (e.g., as described in connection with FIGS. 4A-4B). However, other values for the range are within the scope of the present disclosure.

Accordingly, in FIG. 3B, the scallop profile is such that a width of the isolation structure 310 oscillates from a larger width (e.g., represented by d3 in FIG. 3B) to a smaller width (e.g., represented by d4 in FIG. 3B) back to a larger width (e.g., represented by d5 in FIG. 3B). In some implementations, as shown in FIG. 3B, the larger width d3 above the smaller width d4 may be approximately equal to the larger width d5 below the smaller width d4. Alternatively, the isolation structure may be generally "V-shaped" (that is, smaller in width at a bottom surface as compared with a top surface) such that the larger width d3 above the smaller width d4 is greater than the larger width d5 below the smaller width d4.

Additionally, as shown in FIG. 3B, the isolation structure 310 extends (e.g., by a height represented by h in FIG. 3B) into the supporting layer 302. For example, one or more cycles of oxidation and etching (e.g., as described in connection with FIGS. 4C-4H) used to form the isolation structure 310 may remove a portion of the supporting layer 302 (which is only partly resistant to etching).

The scallop profile and additional extension, into the supporting layer 302, of narrower isolation structures affects performance of an electronic device including the example semiconductor structure 300 (e.g., the example SiPh device 200 or a pixel device, among other examples) significantly less than under-etching of trenches for the narrower isolation structures. As a result, the example semiconductor structure 300 experiences reduced light leakage and light scattering and thus experiences increased efficiency.

As indicated above, FIGS. 3A and 3B are provided as an example. Other examples may differ from what is described with regard to FIGS. 3A and 3B.

FIGS. 4A-4J are diagrams of an example implementation 400 described herein. Example implementation 400 may be an example process for forming an example semiconductor structure (e.g., the example semiconductor structure 300 of FIGS. 3A-3B) having differently sized isolation structures. The semiconductor structure formed using example implementation 400 may be included in an SiPh device (e.g., the example SiPh device 200 of FIG. 2), a pixel sensor, or another type of semiconductor device.

Figure 4A:
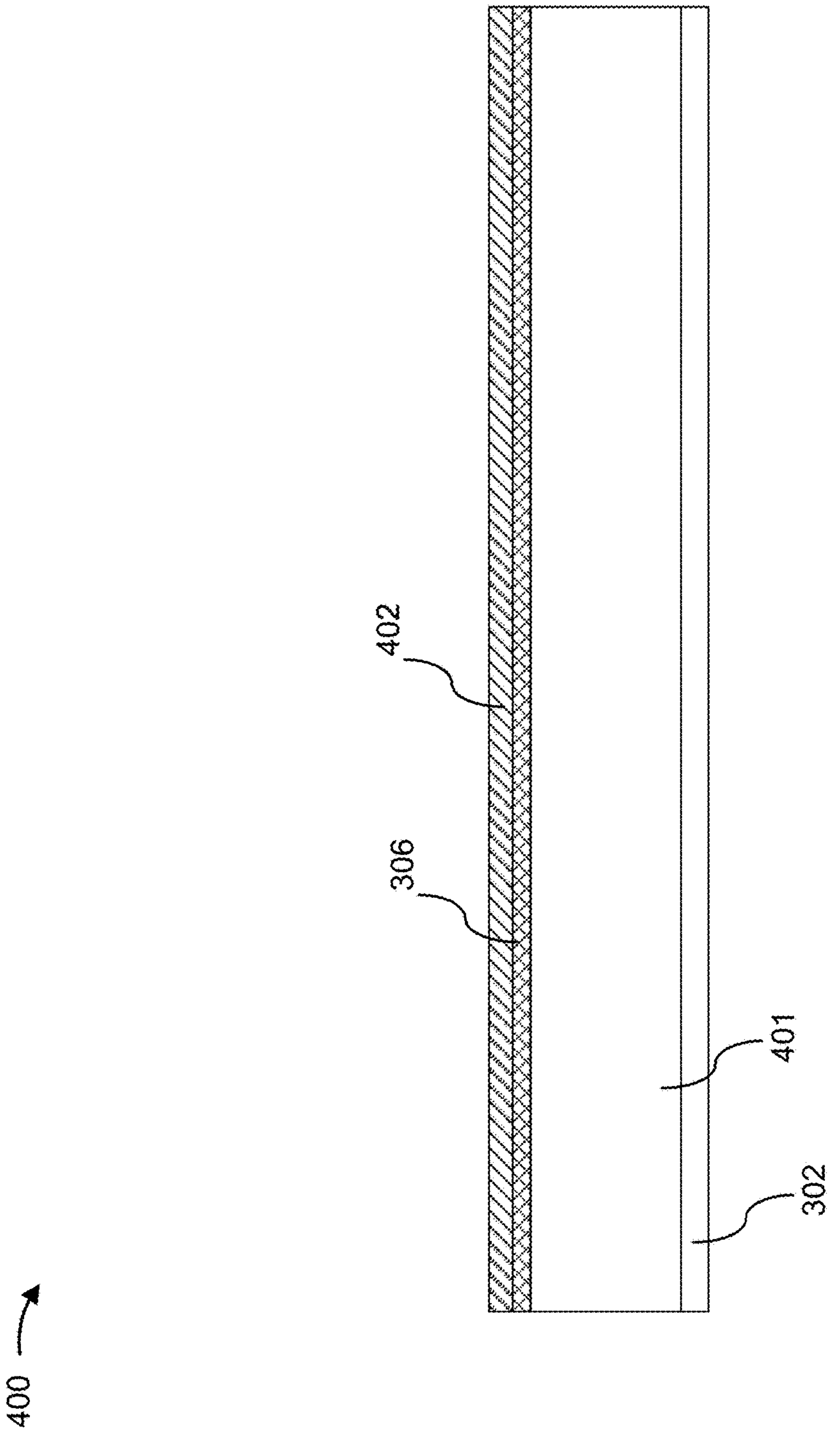
FIGS. 4A-4J are diagrams of an example implementation described herein.

As shown in FIG. 4A, the example process for forming the semiconductor structure may be performed in connection with a supporting layer 302 (that includes at least one ESL) that supports a silicon layer 401, which occupies a volume for formation of operational structures and isolation structures described herein.

As shown in FIG. 4A, a hard mask 306 may be formed over the silicon layer 401. For example, the deposition tool 102 may deposit the hard mask 306 using a CVD technique, a PVD technique, an ALD technique, or another type of deposition technique. The planarization tool 110 may planarize the hard mask 306 after the hard mask 306 is deposited.

As further shown in FIG. 4A, a photoresist layer 402 may be formed over the hard mask 306. For example, the deposition tool 102 may deposit the photoresist layer 402 using a CVD technique, a PVD technique, an ALD technique, or another type of deposition technique. The planarization tool 110 may planarize the photoresist layer 402 after the photoresist layer 402 is deposited.

Figure 4B:
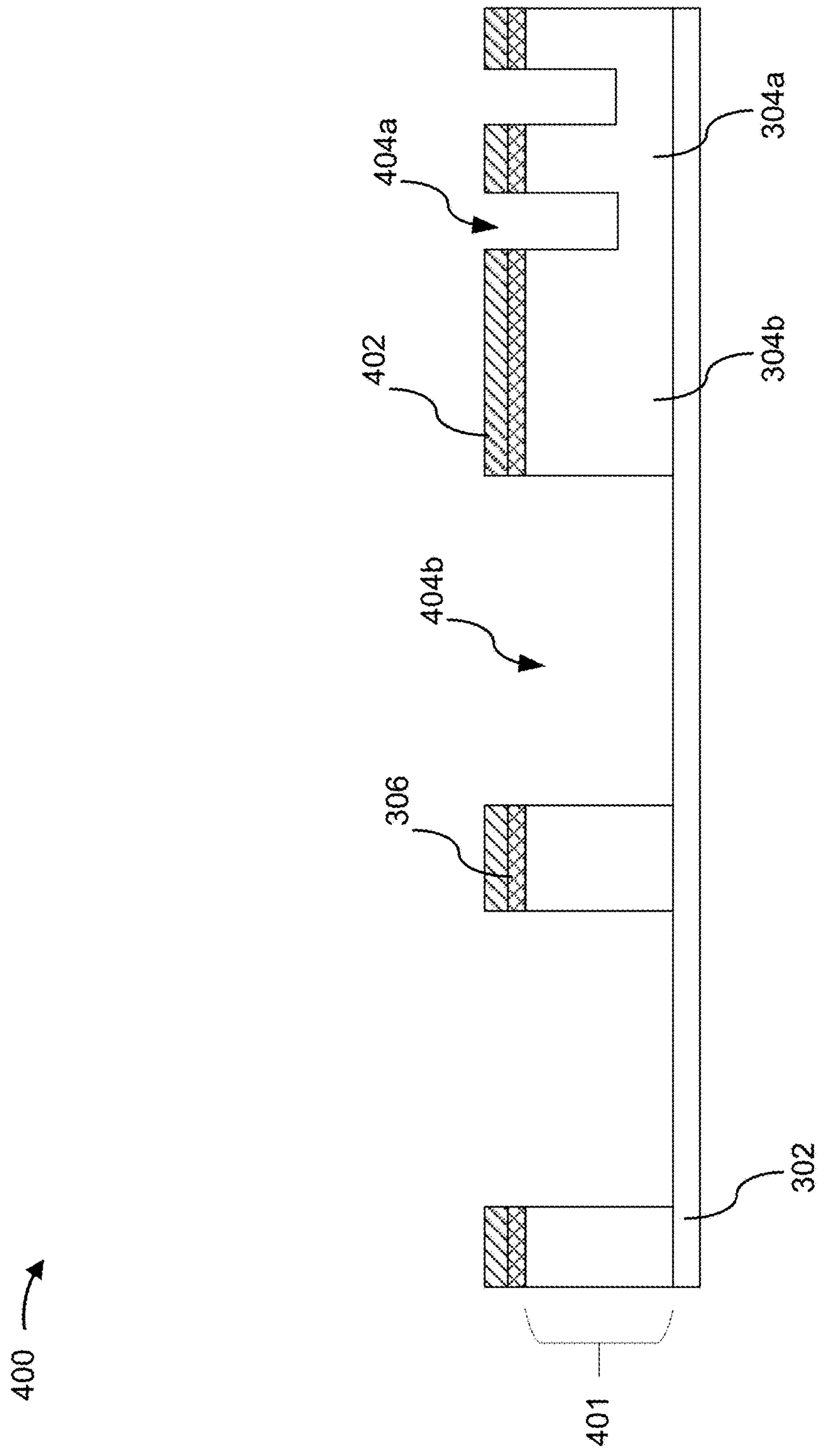

As shown in FIG. 4B, the silicon layer 401 may be etched to form trenches. For example, the exposure tool 104 may expose the photoresist layer 402 to a radiation source to pattern the photoresist layer, the developer tool 106 may develop and remove portions of the photoresist layer 402 to expose the pattern, and the etch tool 108 may etch portions of the silicon layer 401. The pattern may include narrower trenches (e.g., trench 404*a* having a width d1, as described in connection with FIG. 3A) and wider trenches (e.g., trench 404*b* having a width d2, as described in connection with FIG. 3A). As a result, the silicon layer 401 may be patterned into operational structures, such as operational structure 304*a* and operational structure 304*b*. The etch tool 108 may etch the narrower trenches to a shallower depth than the wider trenches (e.g., on account of aspect ratio dependent etching (ARDE)).

Figure 4C:
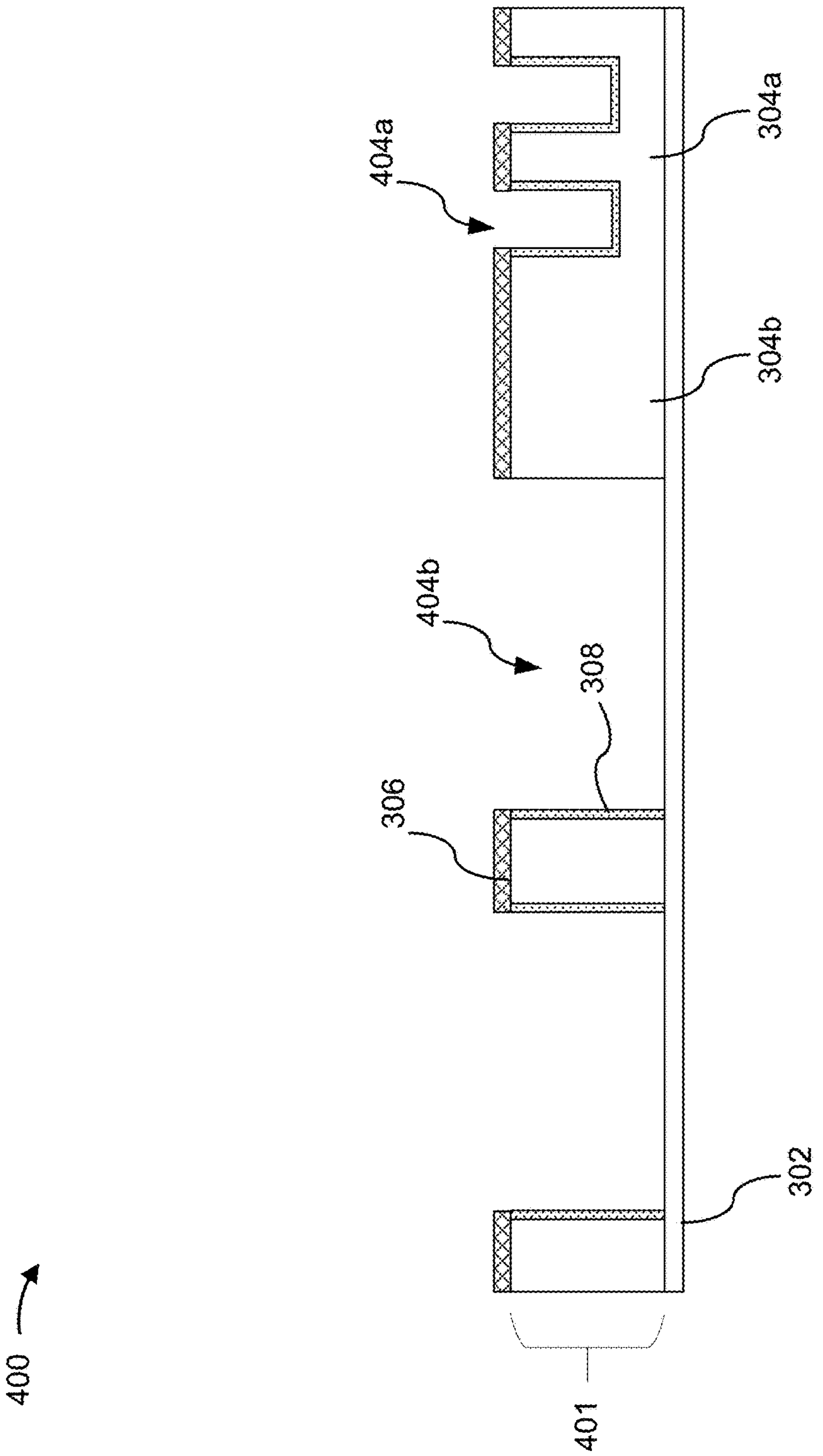

As shown in FIG. 4C, the photoresist layer 402 may be etched. For example, the photoresist removal tool 114 may remove remaining portions of the photoresist layer 402 (e.g., using a chemical stripper, a plasma asher, and/or another technique) after the etch tool 108 etches the silicon layer 401.

As further shown in FIG. 4C, an oxide material 308 may be formed. In some implementations, the annealing tool 116 forms the oxide material 308 by thermally oxidizing surfaces of the silicon layer 401. The annealing tool 116 may also support an oxygen gas or an oxygen plasma during annealing to increase an oxidation rate for the silicon layer 401. Because the silicon layer 401 is thermally oxidized, the oxide material 308 is not formed on the hard mask 306 or on the supporting layer 302. That is, the oxide material 308 is present on sidewalls of the trenches and on bottom surfaces of the narrower trenches but absent from bottom surfaces of the wider trenches.

Additionally, or alternatively, the deposition tool 102 may deposit the oxide material 308 using an ALD technique. Accordingly, the oxide material 308 may be selected for substrate dependency. For example, a precursor used by the deposition tool 102 to grow the oxide material 308 may bond to the silicon layer 401 but not on the hard mask 306 or on the supporting layer 302. As a result, the oxide material 308 is present on sidewalls of the trenches and on bottom surfaces of the narrower trenches but absent from bottom surfaces of the wider trenches.

Figure 4D:
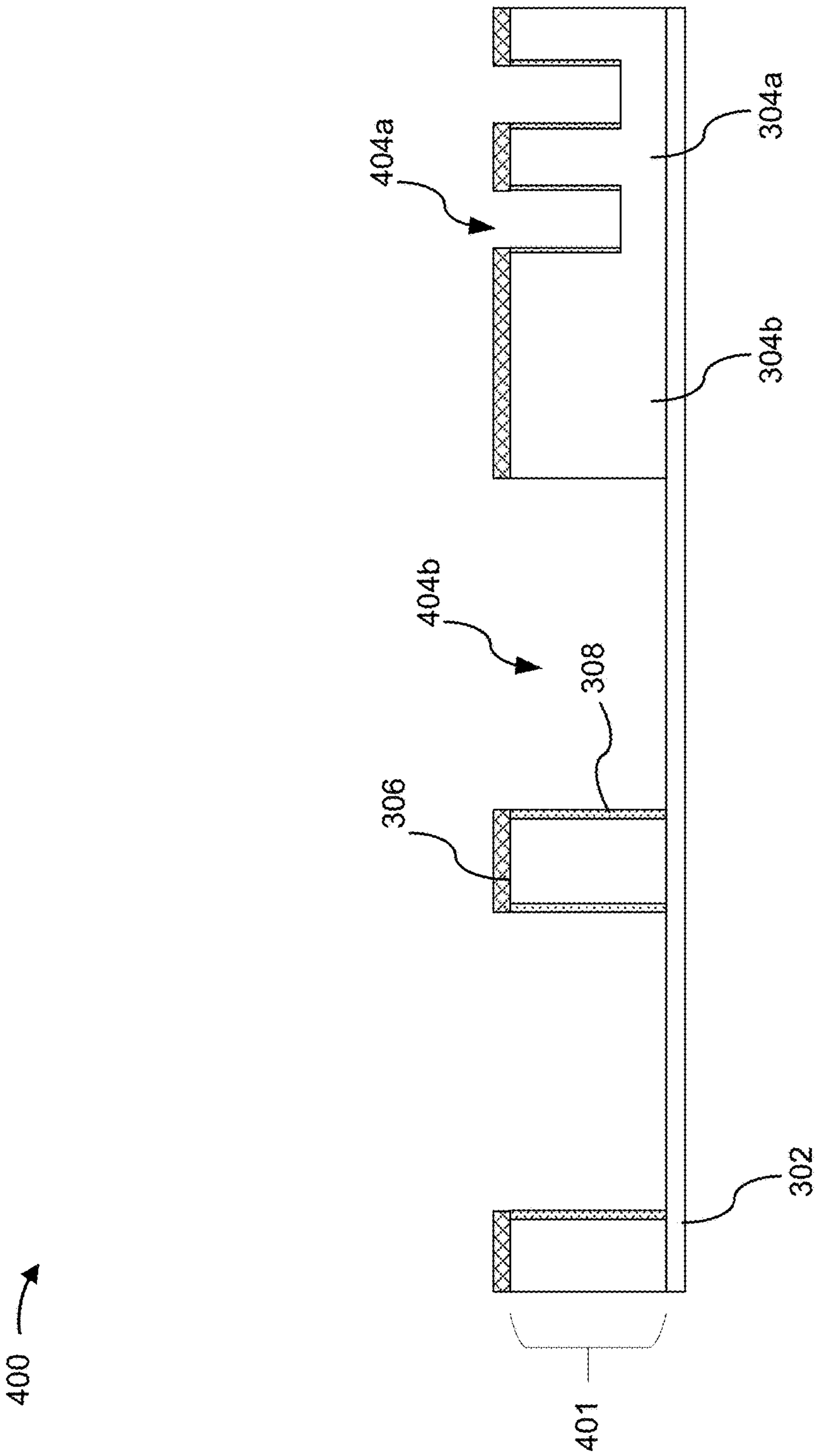

As shown in FIG. 4D, the oxide material 308 may be etched from bottom surfaces of the narrower trenches, such as the trench 404*a*. In some implementations, the etch tool 108 may use anisotropic etching, which results in remaining oxide material 308 on sidewalls of the trenches but not on bottom surfaces of the trenches. In some implementations, the etch tool 108 uses a fluoride-base gas (e.g., tetrafluoromethane ($CF_4$), sulfur hexafluoride ($SF_6$), or trifluoromethane ($CHF_3$), among other examples) for etching.

Figure 4E:
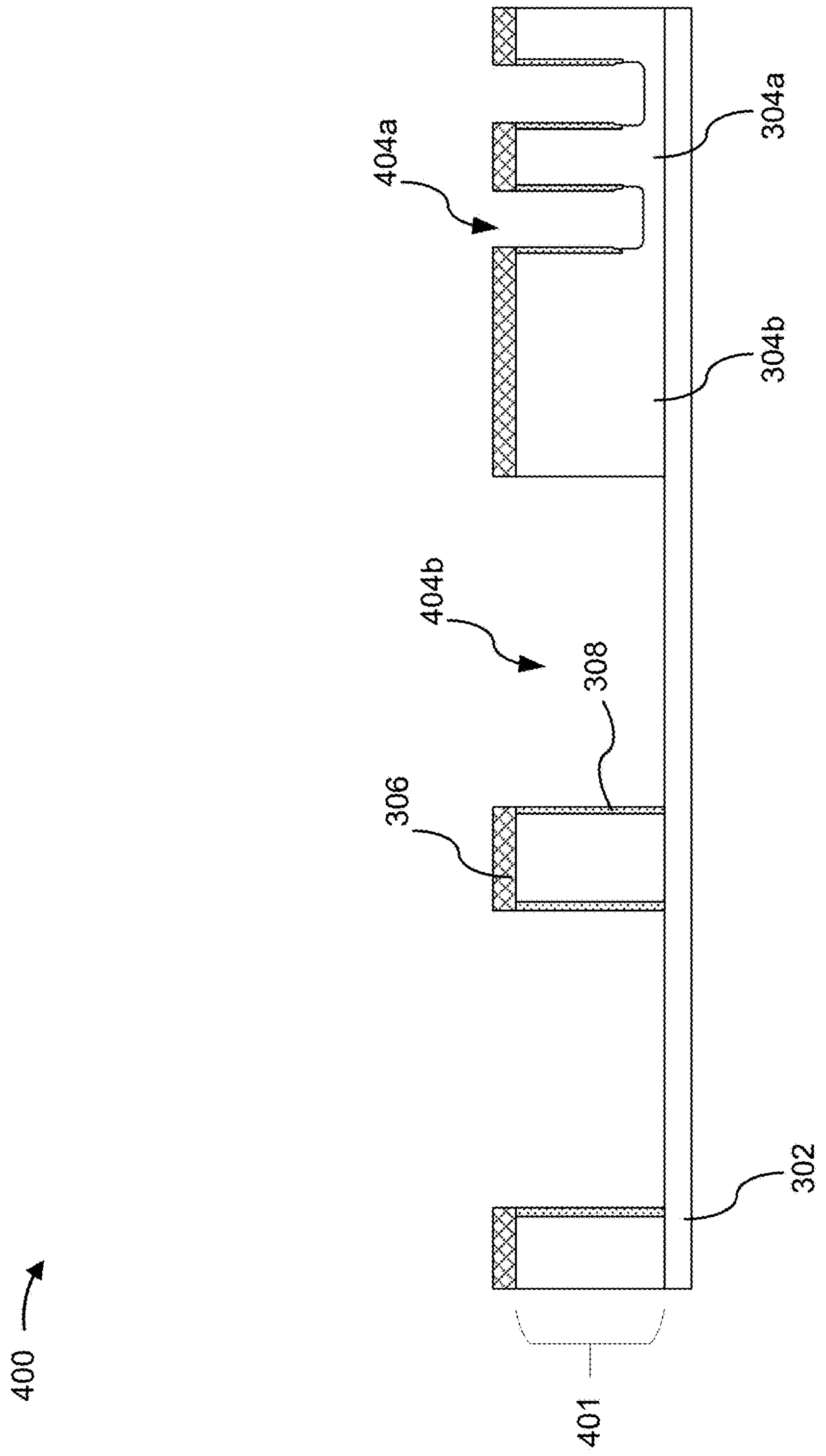

As shown in FIG. 4E, a depth of the narrower trenches may be increased. For example, the etch tool 108 may use wet etching. The oxide material 308 protects sidewalls of the trenches from over-etching. Additionally, the supporting layer 302 is (at least partially) resistant to the wet etching such that a depth of the wider trenches remains approximately the same.

Figure 4F:
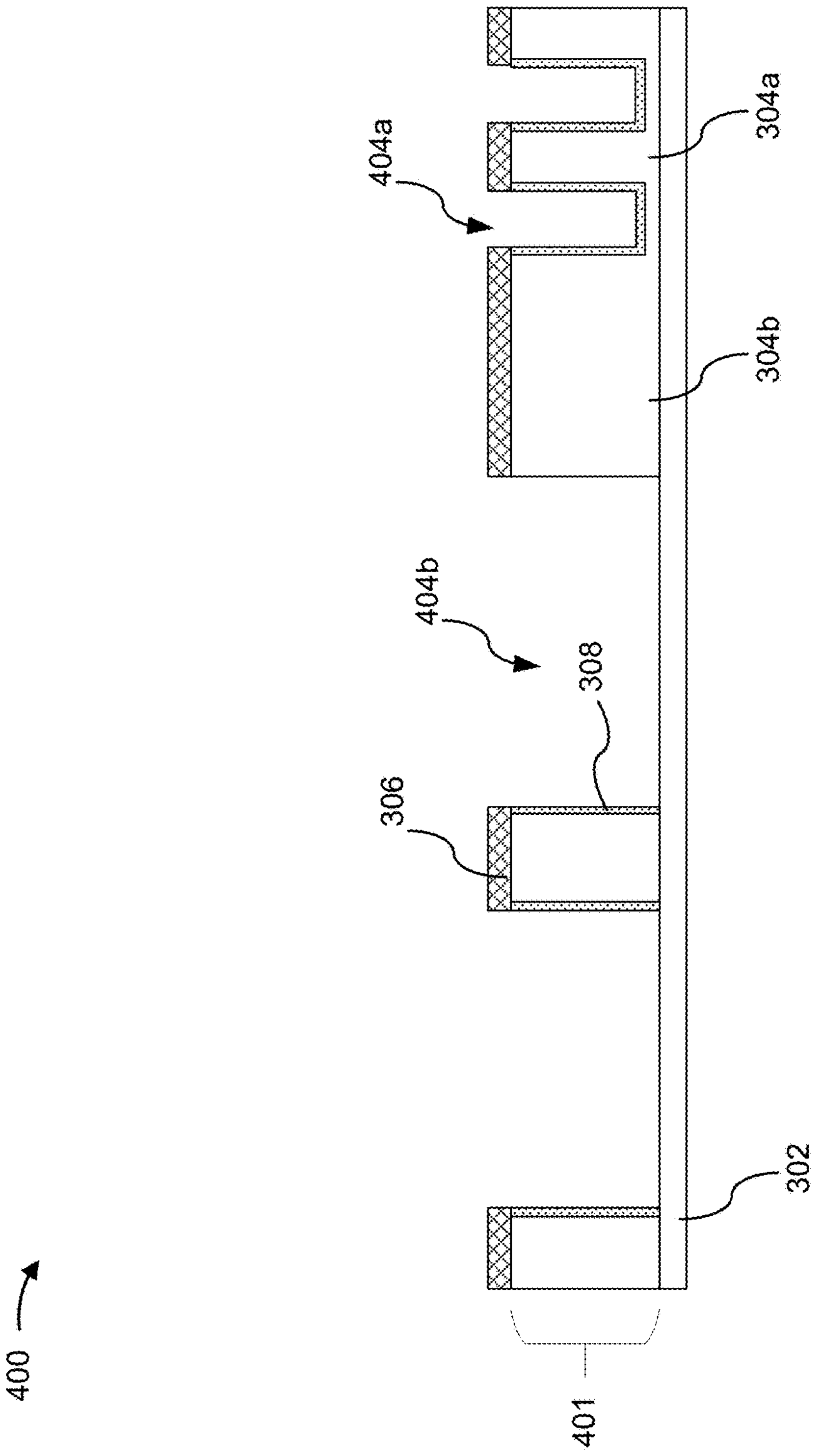

The oxidation and etching described in connection with FIGS. 4C-4E may be repeated. For example, as shown in FIG. 4F, additional oxide material 308 may be formed. In some implementations, the annealing tool 116 forms the oxide material 308 by thermally oxidizing surfaces of the silicon layer 401. For example, the annealing tool 116 may oxidize surfaces of the silicon layer 401 that were newly exposed by the wet etching described in connection with FIG. 4E. Because the silicon layer 401 is thermally oxidized, the oxide material 308 is not formed on the hard mask 306 or on the supporting layer 302. That is, the oxide material 308 is present on sidewalls of the trenches and on bottom surfaces of the narrower trenches but absent from bottom surfaces of the wider trenches.

Figure 4G:
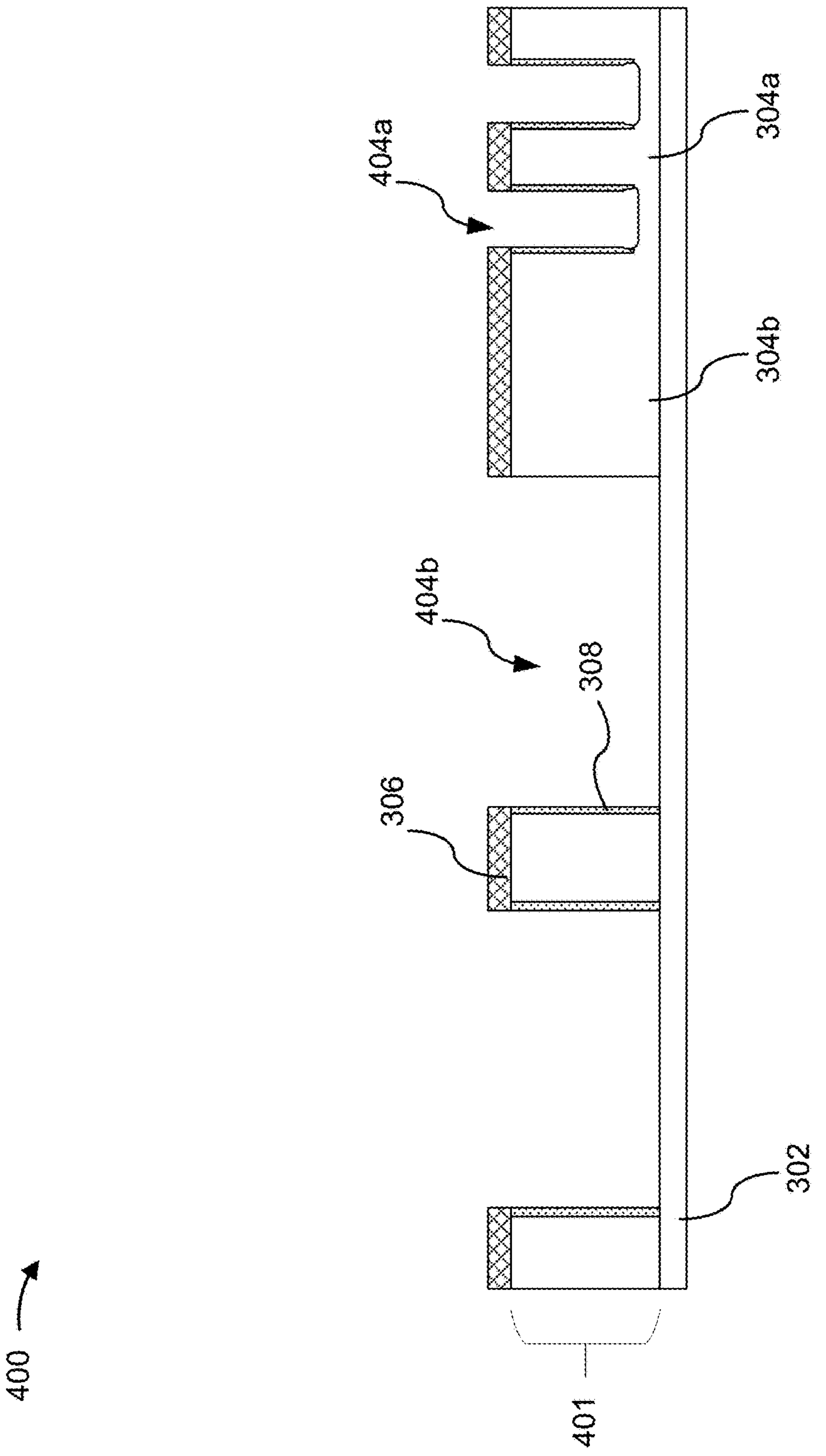

Furthermore, as shown in FIG. 4G, the oxide material 308 may be etched from bottom surfaces of the narrower trenches, such as the trench 404*a*. In some implementations, the etch tool 108 may use anisotropic etching, which results in remaining oxide material 308 on sidewalls of the trenches but not on bottom surfaces of the trenches.

Figure 4H:
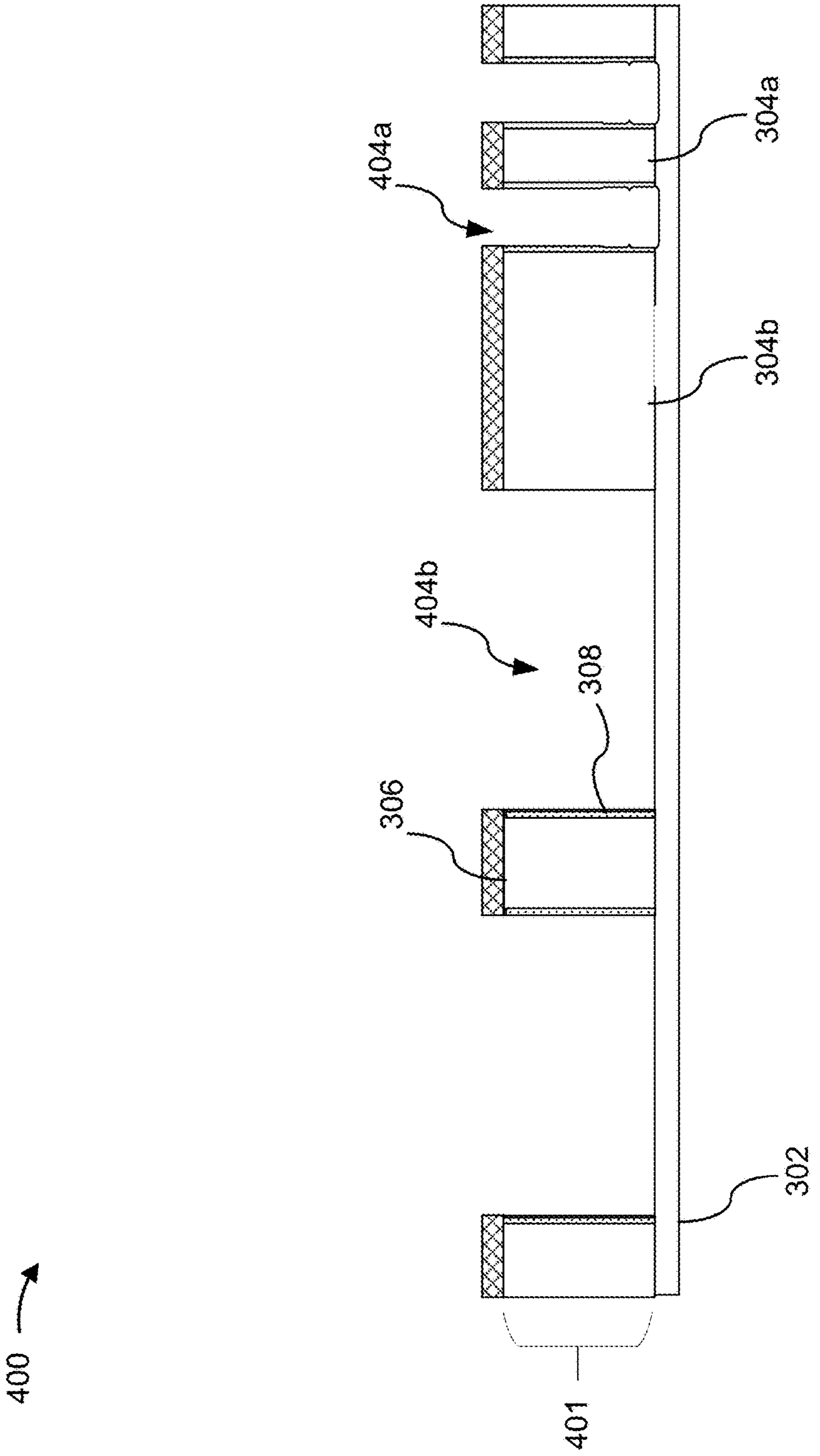

As shown in FIG. 4H, a depth of the narrower trenches may be further increased. For example, the etch tool 108 may use an additional wet etching. The oxide material 308 protects sidewalls of the trenches from over-etching. Additionally, the supporting layer 302 is (at least partially) resistant to the wet etching such that a depth of the wider trenches remains approximately the same.

Although the example implementation 400 is described in connection with two cycles of oxidation and etching, other implementations may use a single cycle of oxidation and etching (e.g., proceeding from actions described in connection with FIG. 4E to actions described in connection with FIG. 4I) or may use additional cycles of oxidation and etching (e.g., repeating actions described in connection with FIGS. 4F-4H before proceeding to actions described in connection with FIG. 4I). A quantity of cycles (e.g., represented by N or another variable) may be selected based on a ratio of a width of the trench 404*b* to a width of the trench 404*a* (e.g., a ratio of d2 to d1). For example, the ratio may be in a range from approximately 1.1 to approximately 33. However, other values for the range are within the scope of the present disclosure. The quantity of cycles may be increased based on the ratio being larger (e.g., closer to 33) and may be decreased based on the ratio being smaller (e.g., closer to 1.1). Therefore, the quantity of cycles may be selected to account for effects of ARDE while still allowing the trench 404*a* to be expanded to an approximately equal depth as the trench 404*b* (account for the trench 404*a* possibly extending into the supporting layer 302 more than the trench 404*b*, as described in connection with FIGS. 3A and 3B).

Figure 4I:
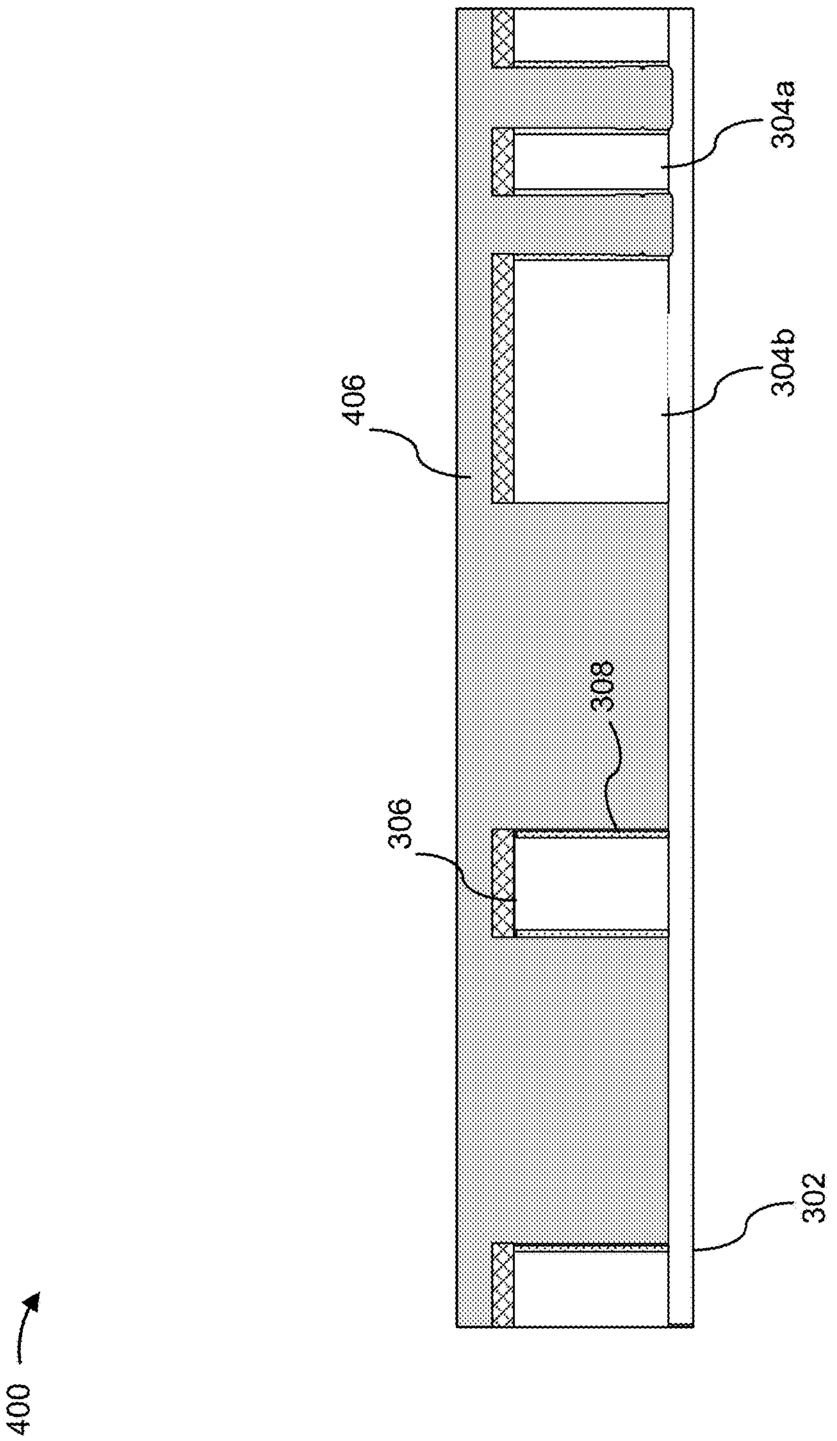

As shown in FIG. 4I, a dielectric material 406 may be formed. The deposition tool 102 may deposit the dielectric material 406 using a CVD technique, a PVD technique, an ALD technique, or another type of deposition technique. Additionally, or alternatively, the plating tool 112 may deposit the dielectric material using an electroplating operation.

Figure 4J:
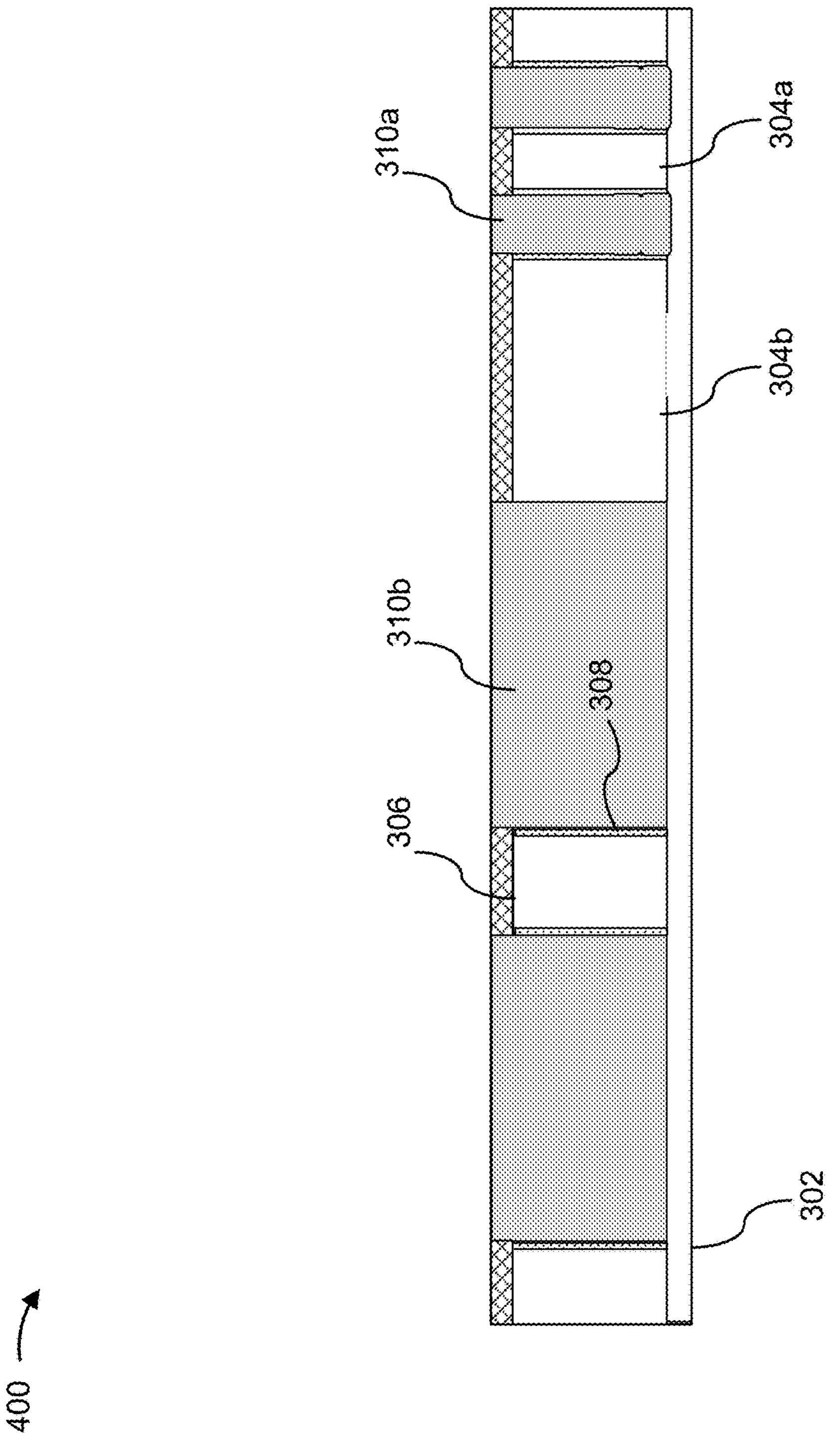

In some implementations, the dielectric material 406 also flows over the hard mask 306. Accordingly, as shown in FIG. 4J, the dielectric material 406 may be planarized. The planarization tool 110 may planarize the dielectric material 406 after the dielectric material 406 is deposited. In some implementations, the planarization tool 110 uses CMP. As a result, the dielectric material 406 may be shaped into isolation structures, such as isolation structure 310*a* and isolation structure 310*b*. Accordingly, the semiconductor structure may include narrower isolation structures (e.g., the isolation structure 310*a* having a width d1, as described in connection with FIG. 3A) and wider isolation structures (e.g., the isolation structure 310*b* having a width d2, as described in connection with FIG. 3A).

In FIG. 4J, the hard mask 306 and the oxide material 308 remain in the semiconductor structure. However, in some implementations, the hard mask 306 may be etched (e.g., by the etch tool 108 and/or the photoresist removal tool 114) before (or after) formation of the isolation structures. Additionally, or alternatively, the oxide material 308 may be removed (e.g., by the etch tool 108) before formation of the isolation structures).

By using techniques as described in connection with FIGS. 4A-4J, trenches with smaller widths, such as the trench 404*a*, may be etched to increased depths without causing over-etching of trenches with greater widths, such as the trench 404*b*. As a result, efficiency of the semiconductor device including the trenches (e.g., an SiPh device or a pixel device, among other examples) is increased. For example, because light leakage and light scattering is reduced in an SiPh device, power is conserved at a transmission device that can decrease transmit power on account of the increased efficiency.

As indicated above, FIGS. 4A-4J are provided as an example. Other examples may differ from what is described with regard to FIGS. 4A-4J.

Figure 5:
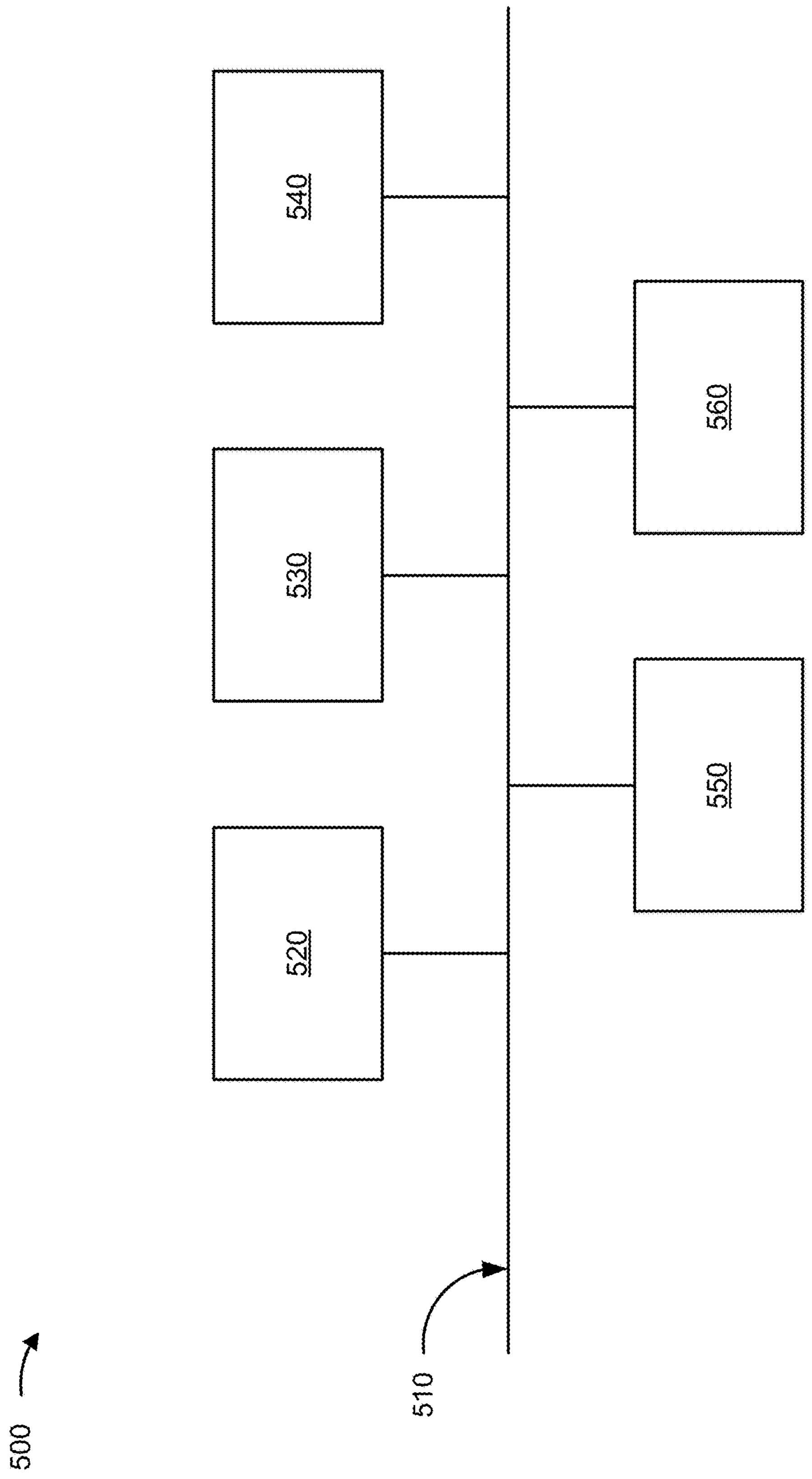
FIG. 5 is a diagram of example components of one or more devices of FIG. 1 described herein.

FIG. 5 is a diagram of example components of a device 500 described herein. In some implementations, one or more of the semiconductor processing tools 102-116 and/or the wafer/die transport tool 118 may include one or more devices 500 and/or one or more components of device 500. As shown in FIG. 5, device 500 may include a bus 510, a processor 520, a memory 530, an input component 540, an output component 550, and a communication component 560.

Bus 510 may include one or more components that enable wired and/or wireless communication among the components of device 500. Bus 510 may couple together two or more components of FIG. 5, such as via operative coupling, communicative coupling, electronic coupling, and/or electric coupling. Processor 520 may include a central processing unit, a graphics processing unit, a microprocessor, a controller, a microcontroller, a digital signal processor, a field-programmable gate array, an application-specific integrated circuit, and/or another type of processing component. Processor 520 is implemented in hardware, firmware, or a combination of hardware and software. In some implementations, processor 520 may include one or more processors capable of being programmed to perform one or more operations or processes described elsewhere herein.

Memory 530 may include volatile and/or nonvolatile memory. For example, memory 530 may include random access memory (RAM), read only memory (ROM), a hard disk drive, and/or another type of memory (e.g., a flash memory, a magnetic memory, and/or an optical memory). Memory 530 may include internal memory (e.g., RAM, ROM, or a hard disk drive) and/or removable memory (e.g., removable via a universal serial bus connection). Memory 530 may be a non-transitory computer-readable medium. Memory 530 stores information, instructions, and/or software (e.g., one or more software applications) related to the operation of device 500. In some implementations, memory 530 may include one or more memories that are coupled to one or more processors (e.g., processor 520), such as via bus 510.

Input component 540 enables device 500 to receive input, such as user input and/or sensed input. For example, input component 540 may include a touch screen, a keyboard, a keypad, a mouse, a button, a microphone, a switch, a sensor, a global positioning system sensor, an accelerometer, a gyroscope, and/or an actuator. Output component 550 enables device 500 to provide output, such as via a display, a speaker, and/or a light-emitting diode. Communication component 560 enables device 500 to communicate with other devices via a wired connection and/or a wireless connection. For example, communication component 560 may include a receiver, a transmitter, a transceiver, a modem, a network interface card, and/or an antenna.

Device 500 may perform one or more operations or processes described herein. For example, a non-transitory computer-readable medium (e.g., memory 530) may store a set of instructions (e.g., one or more instructions or code) for execution by processor 520. Processor 520 may execute the set of instructions to perform one or more operations or processes described herein. In some implementations, execution of the set of instructions, by one or more processors 520, causes the one or more processors 520 and/or the device 500 to perform one or more operations or processes described herein. In some implementations, hardwired circuitry is used instead of or in combination with the instructions to perform one or more operations or processes described herein. Additionally, or alternatively, processor 520 may be configured to perform one or more operations or processes described herein. Thus, implementations described herein are not limited to any specific combination of hardware circuitry and software.

The number and arrangement of components shown in FIG. 5 are provided as an example. Device 500 may include additional components, fewer components, different components, or differently arranged components than those shown in FIG. 5. Additionally, or alternatively, a set of components (e.g., one or more components) of device 500 may perform one or more functions described as being performed by another set of components of device 500.

Figure 6:
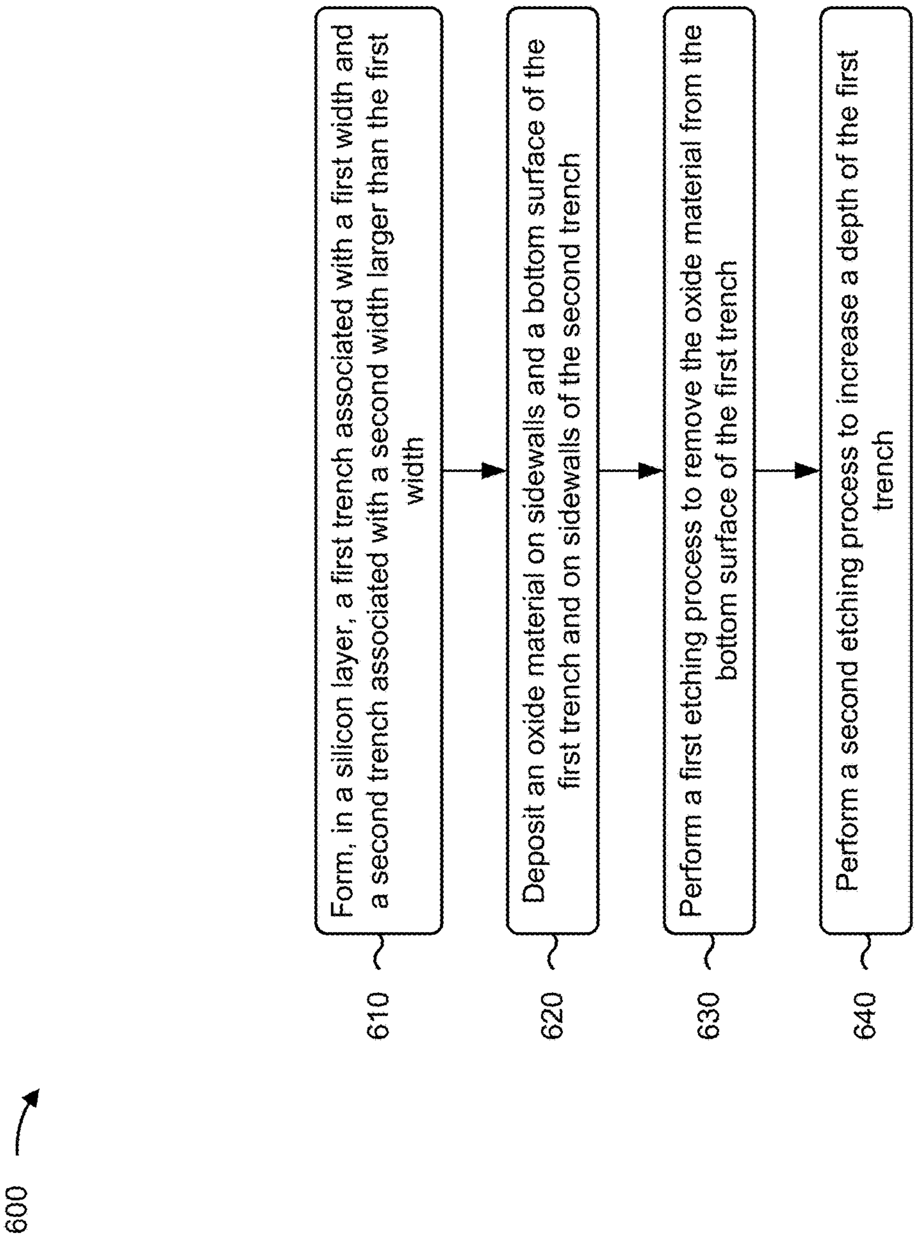
FIG. 6 is a flowchart of an example process associated with forming a semiconductor structure described herein.

FIG. 6 is a flowchart of an example process 600 associated with forming isolation structures described herein. In some implementations, one or more process blocks of FIG. 6 are performed by one or more semiconductor processing tools (e.g., one or more of the semiconductor processing tools 102-116). Additionally, or alternatively, one or more process blocks of FIG. 6 may be performed by one or more components of device 500, such as processor 520, memory 530, input component 540, output component 550, and/or communication component 560.

As shown in FIG. 6, process 600 may include forming, in a silicon layer, a first trench associated with a first width and a second trench associated with a second width larger than the first width (block 610). For example, one or more of the semiconductor processing tools 102-116 may form, in a silicon layer 401, a first trench 404*a* associated with a first width d1 and a second trench 404*b* associated with a second width d2 larger than the first width, as described herein.

As further shown in FIG. 6, process 600 may include depositing an oxide material on sidewalls and a bottom surface of the first trench and on sidewalls of the second trench (block 620). For example, one or more of the semiconductor processing tools 102-116 may deposit an oxide material 308 on sidewalls and a bottom surface of the first trench 404*a* and on sidewalls of the second trench 404*b*, as described herein.

As further shown in FIG. 6, process 600 may include performing a first etching process to remove the oxide material from the bottom surface of the first trench (block 630). For example, one or more of the semiconductor processing tools 102-116 may perform a first etching process to remove the oxide material 308 from the bottom surface of the first trench 404*a*, as described herein.

As further shown in FIG. 6, process 600 may include performing a second etching process to increase a depth of the first trench (block 640). For example, one or more of the semiconductor processing tools 102-116 may perform a second etching process to increase a depth of the first trench 404*a*, as described herein.

Process 600 may include additional implementations, such as any single implementation or any combination of implementations described below and/or in connection with one or more other processes described elsewhere herein.

In a first implementation, forming the first trench and the second trench includes using a photoresist layer 402 and a hard mask layer (e.g., hard mask 306) to form the first trench 404*a* and the second trench 404*b* using photolithography.

In a second implementation, alone or in combination with the first implementation, process 600 includes etching the oxide material 308 from the sidewalls of the first trench 404*a* and the sidewalls of the second trench 404*b*.

In a third implementation, alone or in combination with one or more of the first and second implementations, process 600 includes filling the first trench 404*a* and the second trench 404*b* with at least one dielectric material 406.

In a fourth implementation, alone or in combination with one or more of the first through third implementations, at least one dielectric material 406 is formed over the silicon layer 401, and process 600 includes performing CMP to remove the at least one dielectric material 406 formed over the silicon layer 401.

In a fifth implementation, alone or in combination with one or more of the first through fourth implementations, depositing the oxide material 308 includes oxidizing silicon surfaces of the first trench 404*a* and the second trench 404*b* using an oxygen gas or an oxygen plasma.

In a sixth implementation, alone or in combination with one or more of the first through fifth implementations, depositing the oxide material 308 includes forming the oxide material 308 using ALD.

In a seventh implementation, alone or in combination with one or more of the first through sixth implementations, performing the first etching process includes performing a plasma etching process using a fluoride-base gas.

In an eighth implementation, alone or in combination with one or more of the first through seventh implementations, process 600 includes depositing additional oxide material 308 on sidewalls and the bottom surface of the first trench 404*a* and on sidewalls of the second trench 404*b*, performing a third etching process to remove the additional oxide material 308 from the bottom surface of the first trench 404*a*, and performing a fourth etching process to further increase the depth of the first trench 404*a*.

Although FIG. 6 shows example blocks of process 600, in some implementations, process 600 includes additional blocks, fewer blocks, different blocks, or differently arranged blocks than those depicted in FIG. 6. Additionally, or alternatively, two or more of the blocks of process 600 may be performed in parallel.

In this way, depositing an oxide material on sidewalls of trenches between etching cycles allows narrower trenches to be etched to increased depths without causing over-etching of wider trenches. As a result, efficiency of a device including the trenches (e.g., an SiPh device or a pixel device, among other examples) is increased. For example, because light leakage and light scattering is reduced in an SiPh device, power is conserved at a transmission device that can decrease transmit power on account of the increased efficiency.

As described in greater detail above, some implementations described herein provide a semiconductor structure. The semiconductor structure includes at least one etch stop layer (ESL). The semiconductor structure includes a silicon operational structure, over the at least one ESL, that includes a first isolation structure associated with a first width and a second isolation structure associated with a second width larger than the first width. The sidewall surfaces of the first isolation structure include a scallop profile.

As described in greater detail above, some implementations described herein provide a method. The method includes forming, in a silicon layer, a first trench associated with a first width and a second trench associated with a second width larger than the first width. The method includes depositing an oxide material on sidewalls and a bottom surface of the first trench and on sidewalls of the second trench. The method includes performing a first etching process to remove the oxide material from the bottom surface of the first trench. The method includes performing a second etching process to increase a depth of the first trench.

As described in greater detail above, some implementations described herein provide a semiconductor structure. The semiconductor structure includes at least one etch stop layer (ESL). The semiconductor structure includes a silicon operational structure over the at least one ESL that includes a first isolation structure associated with a first width and a second isolation structure associated with a second width larger than the first width. The semiconductor structure includes an oxide material on sidewall surfaces of the first isolation structure and the second isolation structure and absent from bottom surfaces of the first isolation structure and the second isolation structure.

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:

at least one etch stop layer (ESL); and a silicon operational structure, over the at least one ESL, that includes a first isolation structure associated with a first width and a second isolation structure associated with a second width larger than the first width, wherein sidewall surfaces of the first isolation structure include a scallop profile, and wherein the first isolation structure extends into the at least one ESL and has a bottom surface located lower than a bottom surface of the second isolation structure.

2. The semiconductor structure of claim 1, further comprising:

an oxide material on the sidewall surfaces of the first isolation structure and on sidewall surfaces of the second isolation structure, wherein the oxide material is absent from the bottom surface of the first isolation structure and the bottom surface of the second isolation structure.

3. The semiconductor structure of claim 1, wherein the second isolation structure is adjacent to a line that is associated with a third width smaller than the second width.

4. The semiconductor structure of claim 3, wherein the third width is in a range from approximately 0.3 micrometers (μm) to approximately 10 μm.

5. The semiconductor structure of claim 1, wherein a lower portion of the second isolation structure is wider than the second width, and the lower portion is approximately 30 nanometers or less in height.

6. A semiconductor structure, comprising:

at least one etch stop layer (ESL);

a silicon operational structure over the at least one ESL that includes a first isolation structure associated with a first width and a second isolation structure associated with a second width larger than the first width, wherein the first isolation structure extends into the at least one ESL and has a bottom surface located lower than a bottom surface of the second isolation structure; and an oxide material on sidewall surfaces of the first isolation structure and the second isolation structure and absent from the bottom surface of the first isolation structure and the bottom surface of the second isolation structure.

7. The semiconductor structure of claim 6, wherein the silicon operational structure comprises a waveguide.

8. The semiconductor structure of claim 6, wherein the first isolation structure and the second isolation structure comprise at least one dielectric material.

9. The semiconductor structure of claim 6, wherein the first width is in a range from approximately 0.3 micrometers (μm) to approximately 1 μm.

10. The semiconductor structure of claim 6, wherein the second width is in a range from approximately 1.0 micrometers (μm) to approximately 10 μm.

11. The semiconductor structure of claim 6, wherein a lower portion of the first isolation structure has a tapered sidewall profile.

12. A semiconductor structure, comprising:

a silicon layer that includes:

a first trench associated with a first width and a first depth, and a second trench associated with a second width, larger than the first width, and a second depth less than the first depth;

an oxide material on sidewalls of the first trench and the second trench, wherein the oxide material is absent from a bottom surface of the first trench and the second trench; and a supporting layer, wherein:

the silicon layer resides over the supporting layer, and at least one of:

the first trench extends into the supporting layer, or the second trench resides directly on a top surface of the supporting layer.

13. The semiconductor structure of claim 12, further comprising a hard mask on a top surface of the silicon layer.

14. The semiconductor structure of claim 12, further comprising:

an isolation structure that fills the first trench and the second trench.

15. The semiconductor structure of claim 14, wherein the isolation structure comprises a dielectric material.

16. The semiconductor structure of claim 14, further comprising:

a hard mask on a top surface of the silicon layer, wherein the isolation structure is coplanar with the hard mask.

17. The semiconductor structure of claim 12, wherein the first trench extends into the supporting layer.

18. The semiconductor structure of claim 12, wherein the second trench resides directly on the top surface of the supporting layer.

19. The semiconductor structure of claim 12, wherein a ratio of the second width of the second trench relative to the first width of the first trench is in a range from approximately 1.1 to approximately 33.

20. The semiconductor structure of claim 12, wherein corners of the first trench and the second trench are rounded.

* * * * *